United States Patent [19]
Miyata et al.

[11] Patent Number: 5,382,905
[45] Date of Patent: Jan. 17, 1995

[54] MAGNET APPARATUS FOR MAGNETIC RESONANCE IMAGING

[75] Inventors: Koji Miyata, Fukui; Yuji Inoue, Tokyo, both of Japan

[73] Assignees: Shin-Etsu Chemical Co., Ltd.; Yokogawa Medical Systems, Ltd., both of Tokyo, Japan

[21] Appl. No.: 220,334

[22] Filed: Mar. 30, 1994

[30] Foreign Application Priority Data

Apr. 1, 1993 [JP] Japan ................... 5-098475

[51] Int. Cl.⁶ .................. G01V 3/00; G03G 21/00
[52] U.S. Cl. ................... 324/319; 324/320; 335/302
[58] Field of Search ............ 324/319, 320, 318, 322, 324/307, 309; 128/653.5; 335/302, 304, 306, 296

[56] References Cited

U.S. PATENT DOCUMENTS

| | | | |
|---|---|---|---|
| 4,875,485 | 10/1989 | Matsutani | 324/319 |
| 4,943,774 | 7/1990 | Breneman et al. | 324/318 |
| 5,061,897 | 10/1991 | Danby et al. | 324/319 |
| 5,089,798 | 2/1992 | Miyata | 335/306 |
| 5,134,373 | 7/1992 | Tsuruno et al. | 324/309 |
| 5,194,810 | 3/1993 | Breneman et al. | 324/319 |

FOREIGN PATENT DOCUMENTS

| | | |
|---|---|---|
| 228154A2 | 7/1987 | European Pat. Off. . |
| 262880A2 | 4/1988 | European Pat. Off. . |
| 314262A2 | 5/1989 | European Pat. Off. . |

*Primary Examiner*—Louis Arana
*Attorney, Agent, or Firm*—Lowe, Price, LeBlanc & Becker

[57] ABSTRACT

The invention relates to a magnet apparatus for producing a uniform magnetic field for magnetic resonance imaging (MRI). The magnet apparatus is of the type having a pair of permanent magnet discs each of which has a hole in a central region and a yoke structure in which the magnet discs are held opposite to each other. For each magnet disc the yoke structure has an aperture which is in alignment with the hole in the magnet disc. As is usual, a pair of pole plates are attached to the opposite faces of the magnet discs, respectively, so as to produce a uniform magnetic field in a space between the two magnet discs. To ease visual observation of the object of imaging in the afore-mentioned space, such as the head part of a human body, the pole plate on each magnet disc is formed with a hole which is in alignment with the hole in the magnet disc. A video camera can be used. According to the need small pole pieces are attached to the surfaces of the holed pole plates to keep uniformity of the magnetic field.

7 Claims, 2 Drawing Sheets

MAGNET APPARATUS FOR MAGNETIC RESONANCE IMAGING

BACKGROUND OF THE INVENTION

This invention relates to a magnet apparatus for producing a magnetic field for use in magnetic resonance imaging (MRI). The apparatus is of the type having two oppositely arranged permanent magnets.

MRI is a process to form sectional images of biological tissues placed in a uniform magnetic field. In the current medical treatments this process is very useful as a diagnostic tool to obtain cross-sectional images of selected parts of the human body.

A MRI apparatus has a magnet unit to produce a uniform magnetic field in a limited but sufficiently wide space within the apparatus, and for this purpose several types of magnet units are known.

Some MRI apparatus employ a pair of permanent magnet discs each of which is magnetized in the direction of thickness. In a yoke structure the two magnet discs are arranged parallel and opposite to each other, usually in a vertical direction, such that a pole face of one magnet disc faces the opposite pole face of the other. For example, the yoke structure has top and bottom plate parts to which the two magnet discs are fixed, respectively, and a plurality of pillar parts which connect the top and bottom plate parts. To produce a uniform magnetic field within a cylindrical space between the two magnet discs, a pole plate (pole piece) in the form of a disc having an annular protuberance in a peripheral region is placed on the pole face of each magnet disc. The pole plate is made of a ferromagnetic material such as soft iron. In some cases each of the permanent magnet discs has a hole in a central region, and for each magnet disc the yoke structure has an aperture which is in alignment with the hole in the magnet disc. For diagnosis with MRI apparatus of this type the human body is partly and horizontally inserted into the space between the two magnet discs through openings in the yoke structure.

In operating a MRI apparatus of the above described type it is not easy for a MRI engineer to observe the state of the object of imaging. For instance, when the object of imaging is the head part of a human body the engineer is obliged to look into the imaging space in the apparatus in a direction along the lying patient, but it is difficult to clearly grasp the state of the head part or the patient's expression since the spacing between the two magnet discs in the apparatus is only about 50 cm. If it is intended to resolve this inconvenience by widening the spacing between the two magnet discs there arises a problem that the magnetic field in the apparatus is degraded in both intensity and uniformity. If the problem should be solved by using large-sized permanent magnet discs there arises another problem that the MRI apparatus becomes high in production cost and undesirably large in size.

SUMMARY OF THE INVENTION

The present invention relates to a MRI magnet apparatus of the above described type, and an object of the invention is to ease visual observation of the state of the object of imaging such as the head part of a human body inserted into the apparatus without enlarging the size of the magnet discs and widening the spacing between the opposite magnet discs.

The invention provides a magnet apparatus for producing a magnetic field for use in MRI, the apparatus having a pair of permanent magnet discs each of which is magnetized in the direction of thickness and has a hole in a central region, a yoke structure which holds therein the two permanent magnet discs parallel and opposite to each other and for each permanent magnet disc has an aperture which is in alignment with the hole in each permanent magnet disc, and a pair of pole plates which are placed on the opposite faces of the two permanent magnet discs, respectively, so as to produce a uniform magnetic field within a space between the two permanent magnet discs. The apparatus according to the invention is characterized in that the pole plate on each permanent magnet disc is formed with a hole which is in alignment with the hole in the magnet disc so that an object of imaging placed in the aforementioned space can be visually observed through the hole in one of the pole plates.

Thus, the invention has eased visual observation of the interior of the apparatus by a very simple means without enlarging the size of the apparatus or increasing the production cost. When the head part of a patient is inserted into the apparatus according to the invention in which the two permanent magnet discs are spaced in a vertical direction, a MRI engineer can easily and well observe the head part from right above the patient's face through the aligned holes in the upper magnet disc and the pole plate on that magnet disc. Furthermore, these holes can be used to monitor the object of imaging by a video camera which is suitably positioned outside the yoke structure. Besides, the patient can look out through the same holes.

For the observation purposes it suffices to form a hole in the pole plate on one of the two magnet discs, but a similar hole is formed in the other pole plate too in order to keep symmetry of the apparatus and produce a uniform magnetic field. The holing of the pole pates is liable to cause some degradation of the uniformity of the magnetic field, but the uniformity can be restored by suitably attaching a plurality of small pole pieces to the opposite surfaces of the two pole plates.

DESCRIPTION OF THE PREFERRED EMBODIMENTS

Figure 1:
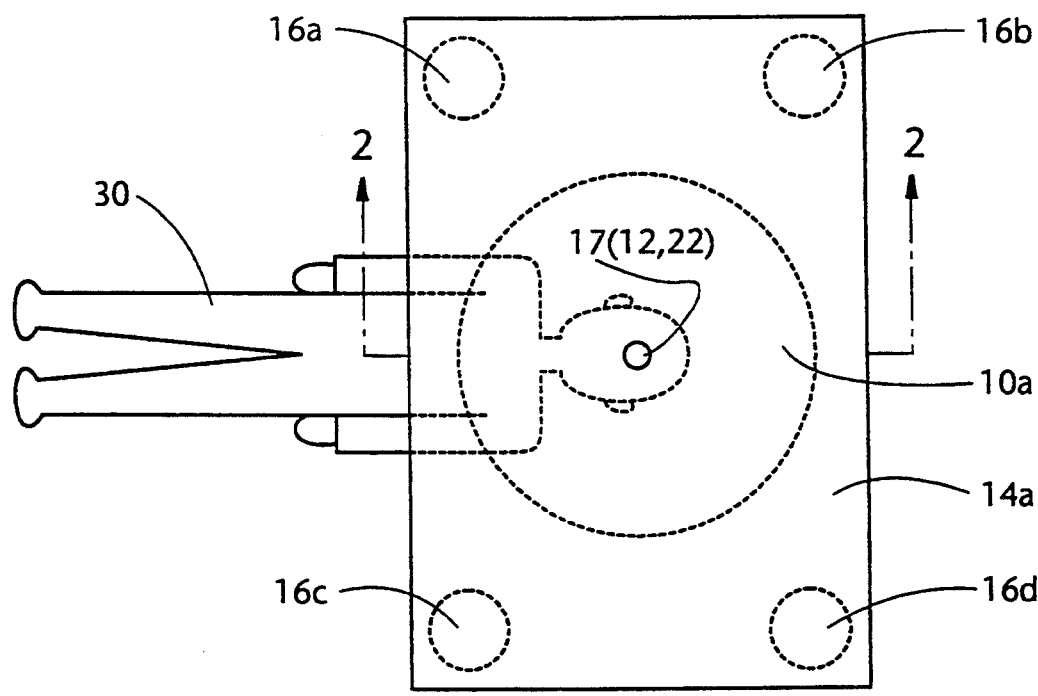
FIG. 1 is a top plan view of a magnet apparatus according to the invention used in a MRI apparatus.
Figure 2:
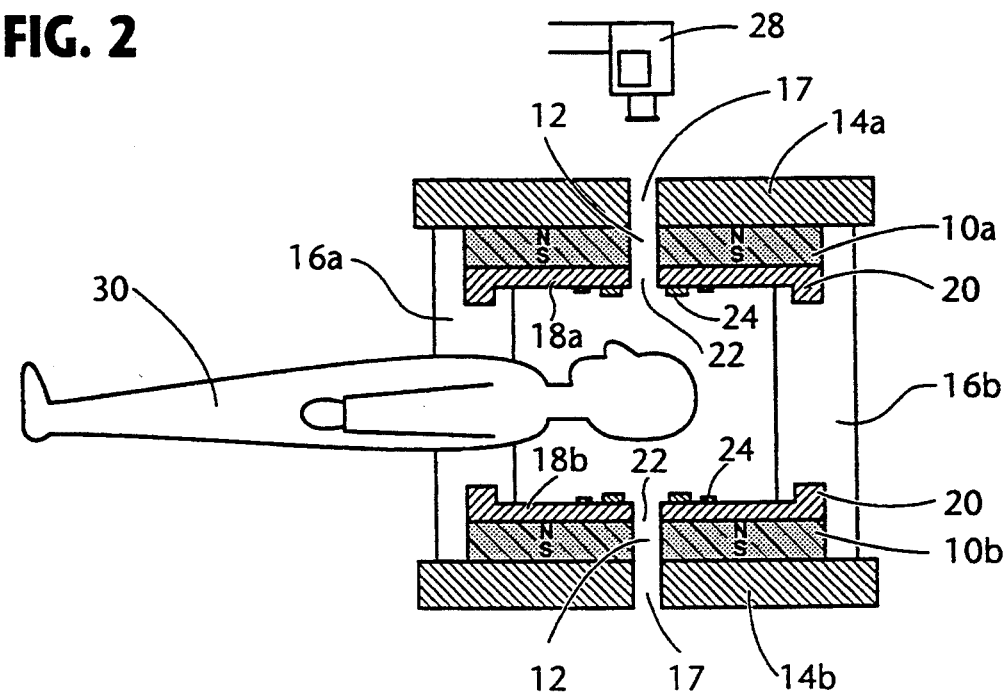
FIG. 2 is an elevational sectional view taken along the line 2—2 in FIG. 1.

As an embodiment of the invention FIGS. 1 and 2 show a magnet apparatus for producing a uniform magnetic field for MRI. The apparatus has a pair of permanent magnet discs 10a and 10b each of which is magnetized in the direction of thickness and has a hole 12 in a central area. The two magnet discs 10a and 10b are held opposite and parallel to each other in a yoke structure which is made up of top and bottom plate parts 14a, 14b and four pillar parts 16a, 16b, 16c, 16d. In this embodiment the top and bottom parts 14a and 14b of the yoke are a pair of rectangular plates arranged opposite and parallel to each other, and the four pillar parts 16a, 16b, 16c, 16d connect the top and bottom plate parts 14a, 14b in four corner regions, respectively. Each of the four pillar parts is a solid cylindrical part. Needless to mention, the top and bottom parts 14a, 14b of the yoke are not necessarily in the form of flat plates, and it is optional to connect the top and bottom parts 14a, 14b by variously differently designed yoke parts. For example, a pair of wall plate parts may be used instead of the illustrated four pillar parts.

The permanent magnet disc 10a is fixed to the bottom face of the top plate part 14a of the yoke and the other permanent magnet disc 10b to the top face of the bottom plate part 14b. The two magnet discs 10a and 10b are arranged right opposite to each other in the center of the columnar space between the two rectangular plate parts 14a and 14b, and the south pole of the magnet disc 10a faces the north pole of the opposite magnet disc 10b. The top and bottom plate parts 14a, 14b of the yoke each have a hole 17 which is in alignment with the hole 12 of each magnet disc 10a, 10b. Usually the hole 17 has the same diameter as the hole 12 of each magnet disc 10a, 10b.

On the bottom face of the magnet disc 10a there is a circular pole plate (pole piece) 18a which is made of a ferromagnetic material such as soft iron and has the same diameter as the magnet disc 10a. The pole plate 18a has an annular protuberance 20 in a peripheral region so as to have a suitably increased thickness in the peripheral region. A similar pole plate 18b is attached to the top face of the opposite magnet disc 10b. The pole plates 18a, 18b are designed such that a uniform magnetic field can be produced in a cylindrical or spherical space between the flat major areas of the two pole plates.

According to the invention, the pole plate 18a attached to the upper magnet disc 10a is formed with a hole 22 in a central area such that the hole 22 aligns with the holes 12 and 17 in the magnet disc 10a and the top plate part 14a of the yoke. Usually the hole 22 has the same diameter as the hole 12 of the magnet disc 10a. That is, by the aligned holes 22, 12, 17 the interior of the yoke assembly communicates with the exterior. The hole 22 is used to observe the object of MRI such as the head part of a human body 30. In order to keep symmetry of the magnet apparatus to thereby produce a uniform magnetic field in the apparatus, the pole plate 18b on the lower magnet disc 10b is also formed with a hole 22 which aligns with the hole 12 of the magnet disc 10b and has the same diameter as the hole 22 in the upper pole plate 18a.

Figure 3:
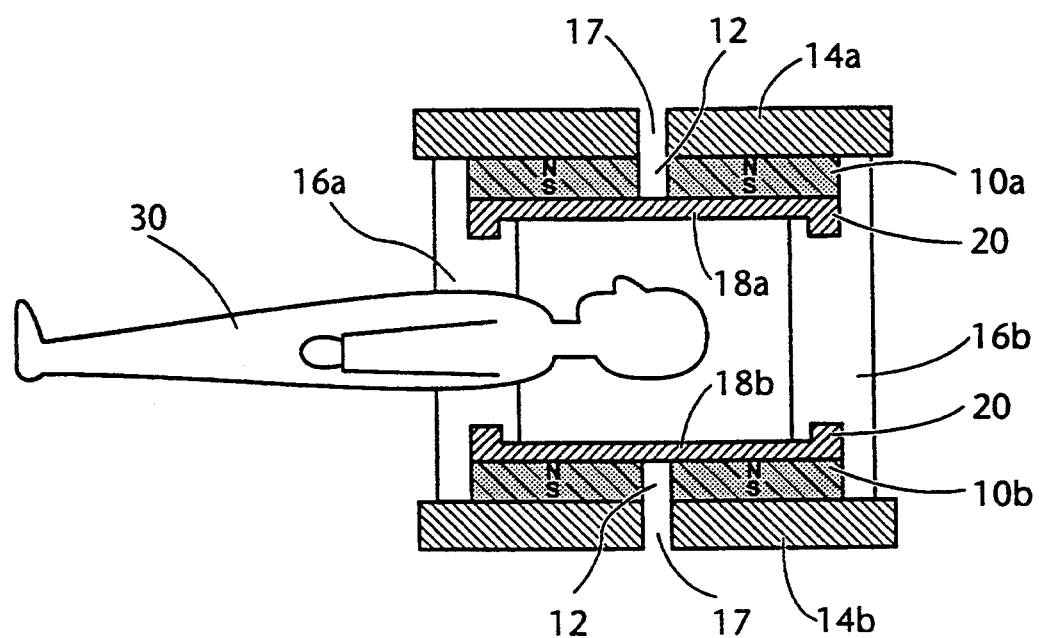
FIG. 3 shows a known magnet apparatus in a sectional view similar to FIG. 2.

For comparison, FIG. 3 shows a known magnet apparatus which has fundamentally the same construction as the apparatus of FIGS. 1 and 2. In this apparatus each of the two magnet discs 10a and 10b has a hole 12 in a central area, and the yoke plate part 14a, 14b on each magnet disc has a hole 17 in alignment with the hole 12 of the magnet disc, but the pole plates 18a, 18b have no hole. Therefore, it is impossible to observe the interior of the magnet apparatus from the topside.

With the magnet apparatus according to the invention, it is easy to look into the interior of the apparatus through the hole 22 in the upper pole plate 18a to observe the state of the object of MRI. Furthermore, it is possible to provide a video camera 28 above the yoke plate part 14a and above the aligned holes 17, 12, 22 in order to monitor the object of MRI at a remote location such as a control room. Besides, when the head part of a patient is inserted in the apparatus the patient can look out through the holes 22, 12, 17, and therefore the patient's uneasy feeling of being confined in a closed room is relieved.

If the uniformity of the magnetic field in the apparatus is intolerably degraded by the provision of the holes 22 in the pole plates 18a, 18b, the uniformity can be restored by adjusting the magnetic field by attaching a plurality of small pole pieces (explanatorily indicated at 24 in FIG. 2) to the surface of each pole plate 18a, 18b in a suitable pattern. Since it is a well known technique to adjust a magnetic field by attaching small pole pieces to the opposite pole pieces of a magnet apparatus, there will be no need for detailed description of the small pole pieces (24) in this invention.

In an example of the apparatus shown in FIGS. 1 and 2, the material of the permanent magnet discs 10a, 10b was a Nd-Fe-B magnet with residual magnetic flux density of 13.2 kG and maximum energy product of 42 MGOe. The magnet discs 10a, 10b were 1100 mm in diameter and 100 mm in thickness, and the diameter of the hole 12 was 80 mm. Both the hole 17 of each yoke plate part 14a, 14b and the hole 22 of each pole plate 18a, 18b had the same diameter of 80 mm. The vertical distance between the two pole plates 18a and 18b was 500 mm. In a spherical space with a diameter of 300 mm in the center between the two pole plates 18a and 18b the uniformity of the magnetic field was measured. When the pole plates 18a, 18b had no hole as shown in FIG. 3, the degree of non-uniformity of the magnetic field was 45 ppm. When the pole plates 18a, 18b were each formed with the hole 22, the magnetic field was readjusted by attaching small pole pieces (24) to the surface of each pole plate 18a, 18b, and consequently the degree of non-uniformity of the magnetic field became 49 ppm. That is, from a practical point of view the hole or window 20 in the pole plate 18a could be provided without substantial degradation of the uniformity of the magnetic field.

What is claimed is:

1. A magnet apparatus for producing a magnetic field for use in magnetic resonance imaging, the apparatus having a pair of permanent magnet discs each of which is magnetized in the direction of thickness and has a hole in a central region, a yoke structure which holds therein said pair of permanent magnet discs parallel and opposite to each other and for each permanent magnet disc has an aperture which is in alignment with said hole in each permanent magnet disc, and a pair of pole plates which are placed on the opposite faces of said pair of permanent magnet discs, respectively, so as to produce a uniform magnetic field within a space between the two permanent magnet discs, characterized in that each of said pair of pole plates is formed with a hole which is in alignment with said hole in each permanent magnet disc so that an object of imaging placed in said space can be visually observed through the hole in one of the pole plates.

2. An apparatus according to claim 1, further comprising a video camera which is positioned outside the yoke structure so as to look the object of imaging through said hole in said one of the pole plates.

3. An apparatus according to claim 1, further comprising a plurality of small pole pieces which are attached to the surface of each of the pole plates so as to restore the uniformity of the magnetic field degraded by forming said hole in each pole plate.

4. An apparatus according to claim 1, wherein said hole in each pole plate has the same diameter as the hole in each permanent magnet disc.

5. An apparatus according to claim 1, wherein each pole plate is a circular plate with the same diameter as each permanent magnet disc and has an annular protuberance in a peripheral region.

6. An apparatus according to claim 1, wherein said pair of permanent magnet discs are vertically opposite to each other.

7. An apparatus according to claim 6, wherein said yoke structure comprises a pair of plate parts to which said pair of permanent magnet discs are fixed, respectively, and a plurality of pillar parts which are positioned outside the circumference of the permanent magnet discs and connect said pair of plate parts.

* * * * *